(12) United States Patent
Akiyama et al.

(10) Patent No.: US 7,579,660 B2
(45) Date of Patent: Aug. 25, 2009

(54) SEMICONDUCTOR DEVICE AND MANUFACTURING METHOD THEREOF

(75) Inventors: Koji Akiyama, Nirasaki (JP); Zhang Lulu, Tsukuba (JP); Morifumi Ohno, Tokyo (JP)

(73) Assignees: Tokyo Electron Limited, Tokyo (JP); Oki Electric Industry Co., Ltd., Tokyo (JP)

( * ) Notice: Subject to any disclaimer, the term of this patent is extended or adjusted under 35 U.S.C. 154(b) by 89 days.

(21) Appl. No.: 11/560,653

(22) Filed: Nov. 16, 2006

(65) Prior Publication Data

US 2007/0126062 A1    Jun. 7, 2007

(30) Foreign Application Priority Data

Nov. 18, 2005  (JP) .............................. 2005-333958

(51) Int. Cl.
  *H01L 27/00*  (2006.01)
(52) U.S. Cl. .................. 257/407; 257/369; 257/250; 257/365; 257/366; 257/392; 257/E29.158; 257/E29.126; 257/E29.128; 257/E29.134; 257/E29.16; 257/E29.264; 257/E29.269; 257/E21.177; 257/E21.179; 257/E21.19; 257/E21.194; 257/E21.621; 257/E21.623; 257/E21.635; 257/288; 438/199

(58) Field of Classification Search ....................... None
See application file for complete search history.

(56) References Cited

U.S. PATENT DOCUMENTS

| 6,864,163 | B1 * | 3/2005 | Yu et al. ...................... 438/585 |
| 7,148,100 | B2 * | 12/2006 | Kim et al. ................... 438/218 |
| 2002/0096724 | A1 * | 7/2002 | Liang et al. ................. 257/369 |
| 2005/0110098 | A1 * | 5/2005 | Yoshihara ................... 257/371 |

FOREIGN PATENT DOCUMENTS

JP    2005-79512    3/2005

* cited by examiner

*Primary Examiner*—Minh-Loan T Tran
*Assistant Examiner*—Fei Fei Yeung Lopez
(74) *Attorney, Agent, or Firm*—Oblon, Spivak, McClelland, Maier & Neustadt, P.C.

(57) ABSTRACT

A semiconductor device includes a substrate including a semiconductor layer at a surface, a gate insulating film disposed on the semiconductor layer, and a gate electrode disposed on the gate insulating film. The gate electrode includes a conductive layer consisting of a nitride of a predetermined metal in contact with the gate insulating film. The conductive layer is formed by stacking a first film consisting of a nitride of the predetermined metal and a second film consisting of the predetermined metal, and diffusing nitrogen from the first film to the second film by solid-phase diffusion.

13 Claims, 4 Drawing Sheets

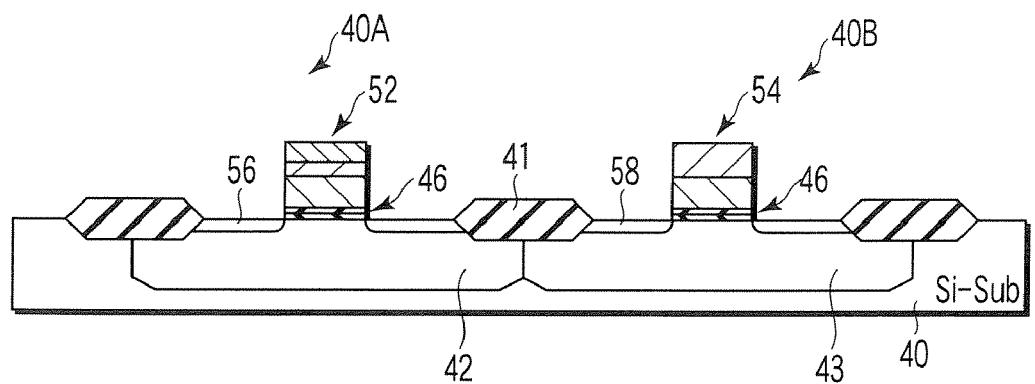
F I G. 13
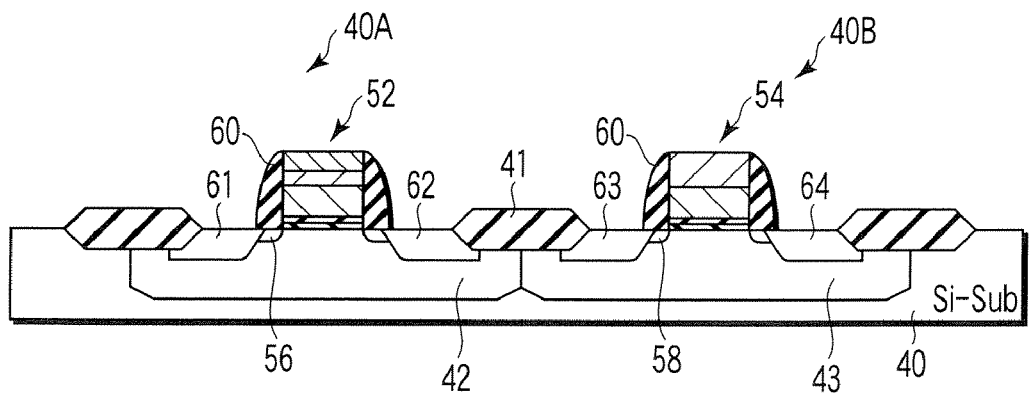
F I G. 14
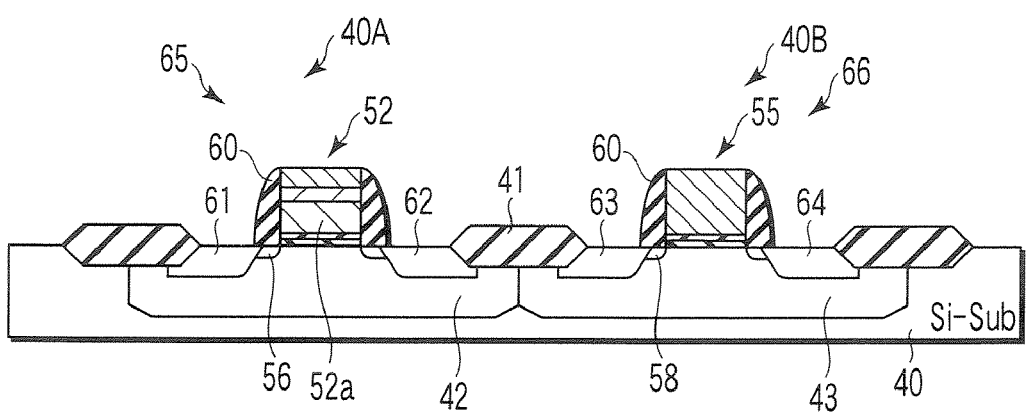
F I G. 15

SEMICONDUCTOR DEVICE AND MANUFACTURING METHOD THEREOF

CROSS-REFERENCE TO RELATED APPLICATIONS

This application is based upon and claims the benefit of priority from prior Japanese Patent Application No. 2005-333958, filed Nov. 18, 2005, the entire contents of which are incorporated herein by reference.

BACKGROUND OF THE INVENTION

1. Field of the Invention

The present invention relates to a semiconductor processing technique, and specifically to a semiconductor device, such as an FET (Field Effect Transistor) of the MIS (Metal Insulator Semiconductor) type, and a manufacturing method for the same. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

Conventionally, in semiconductor devices of the MIS (Metal Insulator Semiconductor) type, representative of which is the MOS (Metal Oxide Semiconductor) type, poly-crystalline silicon (Poly-Si) has been used as the material of gate electrodes. In this case, $n^+$-poly-crystalline silicon is used for the gate electrodes of n-type MISFETs to decrease the threshold voltage thereof. On the other hand, $p^+$-poly-crystalline silicon is used for the gate electrodes of p-type MISFETs to decrease threshold voltage thereof.

Along with scaling down of semiconductor devices, the influence of depletion layers generated in gate electrodes cannot be ignored, so it is required to change the material of gate electrodes from Poly-Si to metal-based materials. However, where metal-based materials are applied to the gate electrodes of complementary transistors of the MIS type, electrodes cannot be differentiated for the n-type and p-type by ion implantation, unlike the case of Poly-Si being used. Accordingly, the gate electrodes of an n-type MISFET and a p-type MISFET need to be formed from metal-based materials having work functions optimum for the respective gate electrodes.

Where the gate electrodes of an n-type MISFET and a p-type MISFET are formed differently from each other, it is necessary to perform etching processes while minimizing the damage to the gate insulating film caused by the processes. If gate insulating films are respectively formed for the two regions, the number of steps and masks are undesirably increased. Further, where a common metal-based material is used for the gate electrodes of an n-type MISFET and a p-type MISFET, a technique for reliably controlling the work functions of the gate electrodes is required.

Jpn. Pat. Appln. KOKAI Publication No. 2005-79512 (Patent Document 1) discloses a technique to control the work function of a gate electrode. According to this technique, the gate electrode is made of Mo and is then doped with nitrogen. Thereafter, a heating process is performed thereon to diffuse nitrogen outward by vapor-phase diffusion, thereby controlling the work function of the gate electrode. Where this technique is applied to a complementary transistor of the MIS type, a process is performed as follows. Specifically, a common Mo film is formed for the gate electrodes of an n-type MISFET and a p-type MISFET, and is then doped with nitrogen as a whole. Then, nitrogen is diffused outward only from a portion of the Mo film corresponding to one of the electrodes to adjust the nitrogen dosage, thereby controlling the work functions of the electrodes. However, in this case, nitrogen dosage control depends on vapor-phase diffusion of nitrogen, which cannot necessarily control the work function with high accuracy.

BRIEF SUMMARY OF THE INVENTION

An object of the present invention is to provide a semiconductor device with a gate electrode having a work function controlled with high accuracy, and a manufacturing method for the same.

According to a first aspect of the present invention, there is provided a semiconductor device comprising:

a substrate including a semiconductor layer at a surface;

a gate insulating film disposed on the semiconductor layer; and a gate electrode disposed on the gate insulating film, and including a conductive layer consisting of a nitride of a predetermined metal in contact with the gate insulating film, wherein the conductive layer is formed by stacking a first film consisting of a nitride of the predetermined metal and a second film consisting of the predetermined metal, and diffusing nitrogen from the first film to the second film by solid-phase diffusion.

According to a second aspect of the present invention, there is provided a semiconductor device comprising:

a substrate including a first semiconductor layer of a first conductivity type and a second semiconductor layer of a second conductivity type at a surface;

first and second gate insulating films disposed on the first and second semiconductor layers, respectively;

a first gate electrode disposed on the first gate insulating film, and including a first conductive layer consisting of a nitride of a predetermined metal in contact with the first gate insulating film, the first conductive layer having a first nitrogen concentration; and a second gate electrode disposed on the second gate insulating film, and including a second conductive layer consisting of a nitride of the predetermined metal in contact with the second gate insulating film, the second conductive layer having a second nitrogen concentration lower than the first nitrogen concentration, wherein the first conductive layer is formed from a first film consisting of a nitride of the predetermined metal, and the second conductive layer is formed by stacking the first film and a second film consisting of the predetermined metal, and diffusing nitrogen from the first film to the second film by solid-phase diffusion.

According to a third aspect of the present invention, there is provided a semiconductor device comprising:

a substrate including a first semiconductor layer of a first conductivity type and a second semiconductor layer of a second conductivity type at a surface;

first and second gate insulating films disposed on the first and second semiconductor layers, respectively;

a first gate electrode disposed on the first gate insulating film, and including a first conductive layer consisting of a nitride of a predetermined metal in contact with the first gate insulating film, the first conductive layer having a first thickness T1 and a first nitrogen concentration C1; and a second gate electrode disposed on the second gate insulating film, and including a second conductive layer consisting of a nitride of the predetermined metal in contact with the second gate insulating film, the second conductive layer having a second thickness T2 and a second nitrogen concentration C2, wherein the device is arranged to satisfy C1>C2, T1<T2, and C1×T1≅C2×T2

According to a fourth aspect of the present invention, there is provided a method for manufacturing a semiconductor device comprising a substrate including a semiconductor layer at a surface, and a gate electrode disposed on the semiconductor layer through a gate insulating film, the method comprising:

preparing the substrate having the semiconductor layer;

forming an insulating film as a material of the gate insulating film on the substrate;

forming a first film consisting of a nitride of a predetermined metal on the insulating film;

forming a second film consisting of the predetermined metal on the first film;

patterning the first and second films in accordance with a shape of the gate electrode to leave a laminated body formed of portions of the first and second films correspondingly to the gate electrode; and performing a heating process to diffuse nitrogen in the laminated body from the portion of the first film to the portion of the second film by solid-phase diffusion, thereby forming a conductive layer consisting of a nitride of the predetermined metal in the gate electrode, wherein preset values are adjusted in terms of thicknesses of the first and second films and a nitrogen concentration of the first film to control a nitrogen concentration of the conductive layer that is a factor for determining a work function of the conductive layer.

According to a fifth aspect of the present invention, there is provided a method for manufacturing a semiconductor device comprising a substrate including a first semiconductor layer of a first conductivity type and a second semiconductor layer of a second conductivity type at a surface, and first and second gate electrodes disposed on the first and second semiconductor layers through first and second gate insulating films, respectively, the method comprising:

preparing the substrate having the first and second semiconductor layers;

forming an insulating film as a material of the first and second gate insulating films on the substrate;

forming a first film consisting of a nitride of a predetermined metal on the insulating film;

forming a second film consisting of the predetermined metal on the first film;

patterning the first and second films in accordance with shapes of the first and second gate electrodes to leave a portion of the first film correspondingly to the first gate electrode, and to leave a laminated body formed of portions of the first and second films correspondingly to the second gate electrode; and performing a heating process to diffuse nitrogen in the laminated body from the portion of the first film to the portion of the second film by solid-phase diffusion, thereby forming a conductive layer consisting of a nitride of the predetermined metal in the second gate electrode, wherein preset values are adjusted in terms of thicknesses of the first and second films and a nitrogen concentration of the first film to control a nitrogen concentration of the conductive layer that is a factor for determining a work function of the conductive layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 8, 9, 10, 11, 12, 13, 14, and 15 are sectional views showing sequentially ordered steps in a method for manufacturing a semiconductor device according to a second embodiment of the present invention.

DETAILED DESCRIPTION OF THE INVENTION

Figure 1:
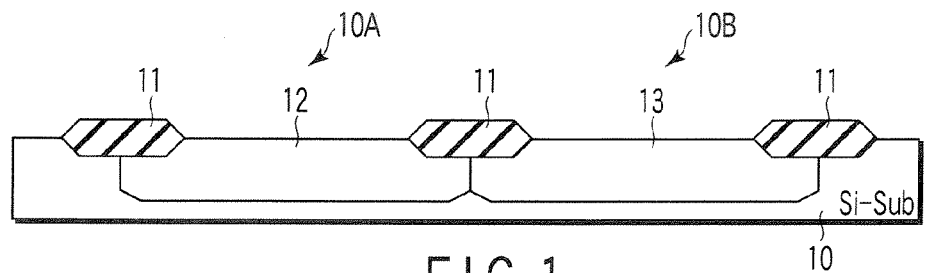
FIGS. 1, 2, 3, 4, 5, 6, and 7 are sectional views showing sequentially ordered steps in a method for manufacturing a semiconductor device according to a first embodiment of the present invention.

Embodiments of the present invention will now be described with reference to the accompanying drawings. In the following description, the constituent elements having substantially the same function and arrangement are denoted by the same reference numerals, and a repetitive description will be made only when necessary.

First Embodiment

FIGS. 1 to 7 are sectional views showing sequentially ordered steps in a method for manufacturing a semiconductor device according to a first embodiment of the present invention. In this embodiment, an explanation will be given of a CMOS (Complementary Metal Oxide Semiconductor) FET and a manufacturing method for the same, where TaN is used as the gate electrode material.

At first, as shown in FIG. 1, a p-type well 12 and an n-type well 13 are respectively formed in the surface of first and second areas 10A and 10B of a semiconductor substrate 10 consisting of silicon. Further, a device isolation area 11 is formed in the surface of the substrate 10 to surround the first and second areas 10A and 10B. The first and second areas 10A and 10B correspond to areas for forming an n-type MISFET and a p-type MISFET, respectively.

Figure 2:
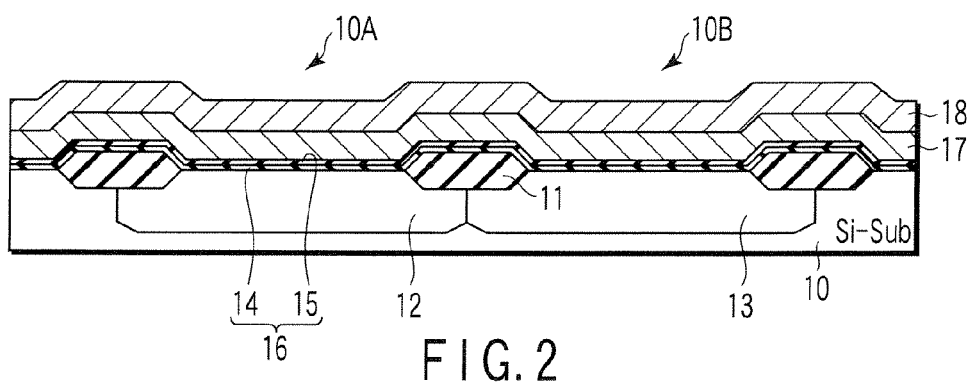

Then, as shown in FIG. 2, an underlying insulating film 14 formed of a silicon oxide film or silicon oxynitride film is formed all over the main surface of the semiconductor substrate 10. Further, a High-k film 15, which is an insulating film with a high dielectric constant, is formed on the underlying insulating film 14. The underlying insulating film 14 and High-k film 15 constitute a gate insulating film 16. The High-k film 15 is preferably made of $HfO_2$, $HfSi_xO_y$, or the like. Since the High-k film 15 has a dielectric constant higher than that of $SiO_2$ conventionally used for gate insulating films, it can provide a smaller EOT value (Equivalent Oxide film Thickness: the thickness of an $SiO_2$ film having an equivalent capacity). Then, a TaN film 17 and a Ta film 18 are formed in this order all over the gate insulating film 16.

Figure 3:
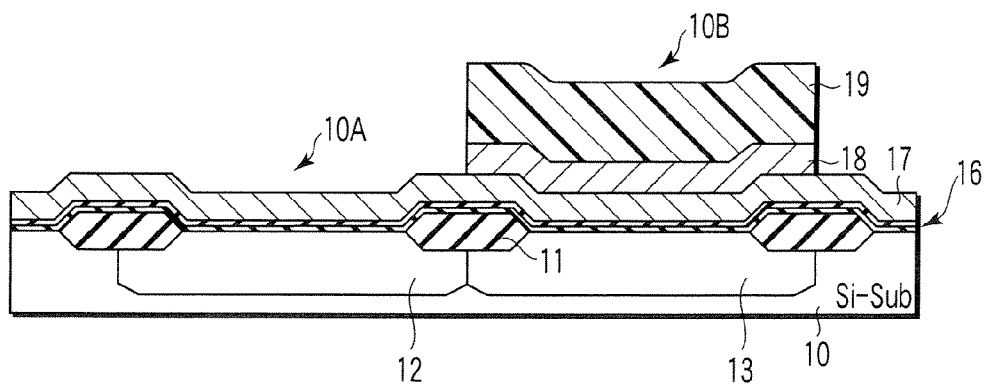

Then, as shown in FIG. 3, a photo-resist film 19 used as an etching mask is formed to cover the second area 10B. Then, a portion of the Ta film 18 corresponding to the first area 10A is removed by wet etching using diluted hydrogen fluoride or RIE etching.

Figure 4:
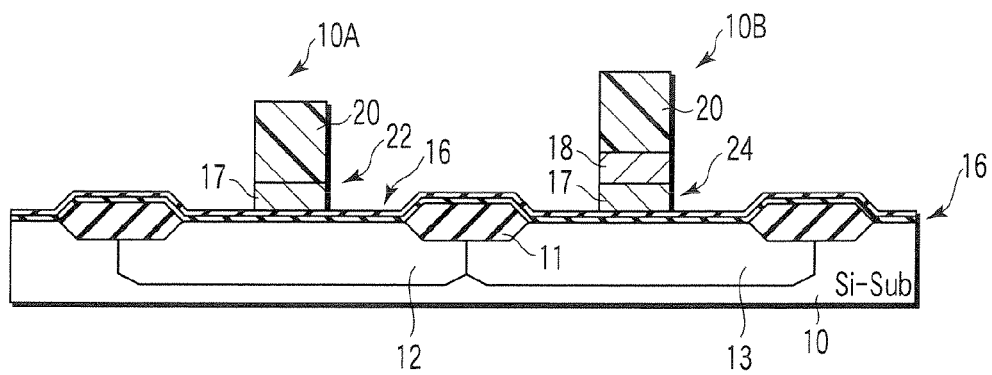

Then, as shown in FIG. 4, a resist pattern 20 for forming gate electrodes is formed by a photolithography method. Then, using the resist pattern 20, anisotropic etching, such as RIE, is performed. Consequently, a conductive layer 22 consisting of a remaining portion of the TaN film 17 is formed within the first area 10A. Further, a laminated body 24 having a two-layer structure consisting of remaining portions of the TaN film 17 and Ta film 18 is formed within the second area 10B. At this time, in order to protect the conductive layer 22 and laminated body 24, a cap film (not shown), such as a silicon nitride film or silicon oxide film, is preferably formed before the photo-resist pattern 20 is formed.

Figure 5:
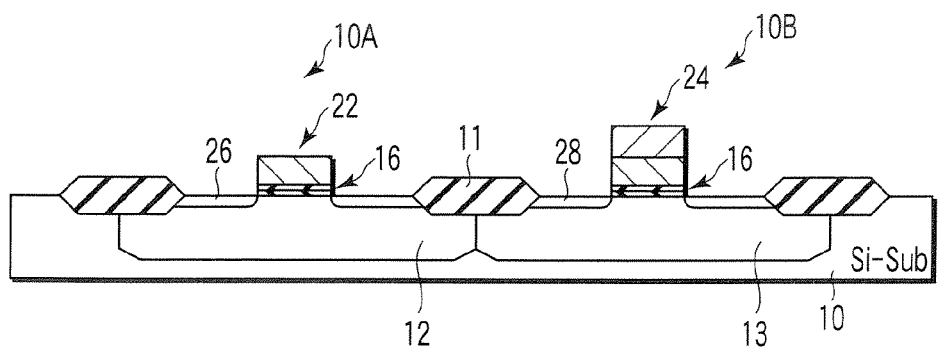

Then, as shown in FIG. 5, the gate insulating film 16 is etched to remove the unnecessary portion thereof exposed on the substrate surface around the conductive layer 22 and laminated body 24. Then, extensions 26 and 28 are formed within the first and second areas 10A and 10B, respectively, by conventional techniques. The extensions are to be used as lightly doped regions in the source/drain layers of the MISFETs. The extension 26 within the first area 10A is formed by ion implantation using a photo-resist mask covering the second area 10B. On the other hand, the extension 28 within the second area 10B is formed by ion implantation using a photo-resist mask covering the first area 10A.

Figure 6:
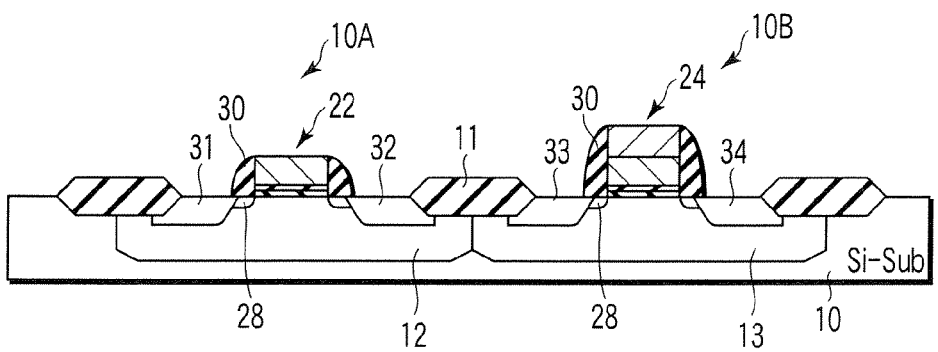

Then, as shown in FIG. 6, a gate sidewall 30 consisting of an insulating film is formed on each of the conductive layer 22 and laminated body 24. For example, the gate sidewall 30 is preferably formed of a silicon nitride film. Then, n-type source/drain layers 31 and 32 are formed within the first area 10A by ion implantation using the conductive layer 22 and the sidewall 30 thereof as a mask. Similarly, p-type source/drain layers 33 and 34 are formed within the second area 10B by ion implantation using the laminated body 24 and the sidewall 30 thereof as a mask.

Figure 7:
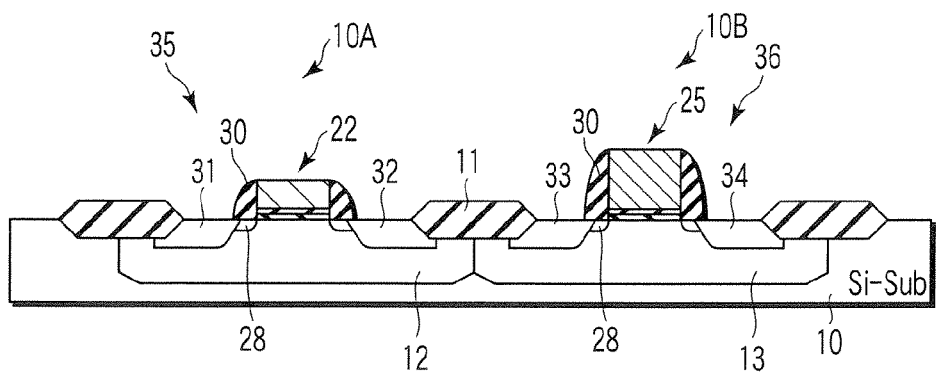

Then, as shown in FIG. 7, annealing is performed to electrically activate ion-implanted impurities in the substrate 10, and to diffuse N in the laminated body 24 of the second area 10B from the TaN film 17 to Ta film 18 by solid-phase diffusion. Consequently, a single layer having an N-concentration lower than that in the TaN film 17 is formed as a conductive layer 25. By adjusting the N-concentration of the layer, the work function of the layer can be controlled, so the threshold voltage of the transistor can be controlled. At this time, the annealing conditions depend on conditions for activating ion-implanted impurities in the substrate 10. However, for N diffusion, the annealing temperature is preferably set to be about 600 to 1,000° C., and the annealing time is preferably set to be about 10 to 600 seconds. Further, where the annealing for activating impurities is insufficient for N diffusion, an additional heating process may be performed for N diffusion.

Thereafter, inter-level insulating films, interconnections, and so forth are formed by conventional techniques to complete the n-type MISFET 35 and p-type MISFET 36 within the first and second areas 10A and 10B, respectively. Specifically, the n-type MISFET 35 has a gate electrode formed only of the conductive layer 22 consisting of a remaining portion of the TaN film 17. On the other hand, the p-type MISFET 36 has a gate electrode formed of a conductive layer 25 derived from the laminated body 24 consisting of remaining portions of the TaN film 17 and Ta film 18.

Specifically, the lowermost portion (conductive layer 22) of the gate electrode of the n-type MISFET 35 is set to have a work function of 3.9 to 4.2 eV, which is close to that of $n^+$-poly-crystalline silicon, to decrease the threshold voltage of the n-type MISFET. On the other hand, the lowermost portion (conductive layer 25) of the gate electrode of the p-type MISFET 36 is set to have a work function of 4.8 to 5.3 eV, which is close to that of $p^+$-poly-crystalline silicon, to decrease the threshold voltage of the p-type MISFET. The preset values of the thicknesses of the TaN film 17 and Ta film 18 and the nitrogen concentration of the TaN film 17 are adjusted to control the nitrogen concentrations of the conductive layers 22 and 25 that are factors for determining the work functions of the conductive layers 22 and 25. Since TaN greatly varies in work function with change in N-concentration, the work function of the conductive layer 25 can be reliably controlled by, e.g., utilizing the thickness of the Ta film 18 as a parameter.

Specifically, the TaN film 17 used as the origin of the conductive layer 22 is formed under conditions to attain an atomic ratio of N/Ta>1.2 in the film, so that the gate electrode of the n-type MISFET 35 has a predetermined work function. Further, the thickness of the Ta film 18 is suitably set to attain an atomic ratio of N/Ta=0.8 to 1.0 in the conductive layer 25, so that the gate electrode of the p-type MISFET 36 has a predetermined work function. In this case, since N is diffused by annealing from the TaN film 17 to Ta film 18 by solid-phase diffusion to provide a predetermined N-concentration as a whole, this N-concentration can be accurately controlled by the film thickness ratio between the TaN film 17 and Ta film 18. Consequently, the work function of the conductive layer 25 can be accurately controlled to be a predetermined value, thereby realizing high accuracy control on threshold voltage. In general, the thickness of a gate electrode is preferably set to be 10 to 50 nm, and the film thickness ratio described above is set to satisfy this range. The relationship between the film thickness and nitrogen concentration can be expressed in numerical terms, as follows. Specifically, where the conductive layer 22 (TaN film 17) has a thickness T1 and nitrogen concentration C1, and the conductive layer 25 has a thickness T2 and a nitrogen concentration C2, it is set to satisfy C1>C2, T1<T2, and C1×T1≅C2×T2. Ideally, C1×T1=C2×T2.

Experiment

The conductive layer 22 of the gate electrode of the n-type MISFET 35 was prepared from a TaN film having a ratio of N/Ta=1.4 and a thickness of 30 nm. On the other hand, the conductive layer 25 of the gate electrode of the p-type MISFET 36 was prepared by forming a Ta film having a thickness of 20 nm on the TaN film described above, and then subjecting the films to annealing at 950° C. for 10 seconds. The conductive layer 25 had a ratio of N/Ta=0.8. In a CMOSFET thus manufactured, the gate electrode of the n-type MISFET 35 had a work function of 4.2 eV, and the gate electrode of the p-type MISFET 36 had a work function of 4.8 eV. Accordingly, it was confirmed that this CMOSFET was sufficiently operable.

Second Embodiment

FIGS. 8 to 15 are sectional views showing sequentially ordered steps in a method for manufacturing a semiconductor device according to a second embodiment of the present invention. Also in this embodiment, an explanation will be given of a CMOSFET and a manufacturing method for the same, where TaN is used as the gate electrode material, as in the first embodiment.

Figure 8:
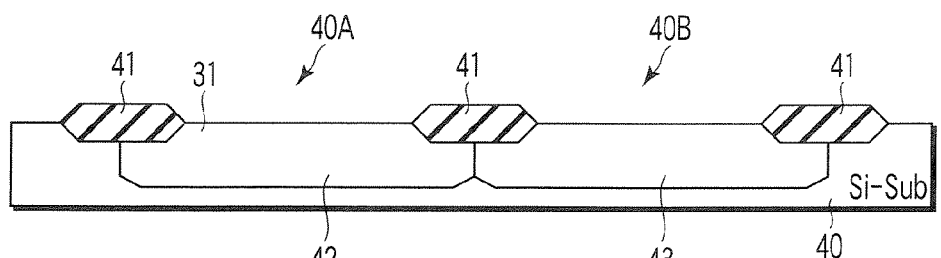

At first, as shown in FIG. 8, a p-type well 42 and an n-type well 43 are respectively formed in the surface of first and second areas 40A and 40B of a semiconductor substrate 40 consisting of silicon. Further, a device isolation area 41 is formed in the surface of the substrate 40 to surround the first and second areas 40A and 40B. The first and second areas 40A and 40B correspond to areas for forming an n-type MISFET and a p-type MISFET, respectively.

Figure 9:
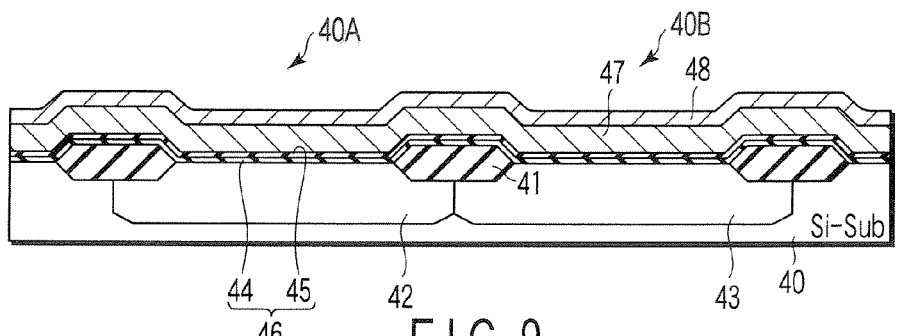

Then, as shown in FIG. 9, an underlying insulating film 44 formed of a silicon oxide film or silicon oxynitride film is formed all over the main surface of the semiconductor substrate 40. Further, a High-k film 45, which is an insulating film with a high dielectric constant, is formed on the underlying insulating film 44. The underlying insulating film 44 and High-k film 45 constitute a gate insulating film 46. Then, a TaN film 47 and a TiN film 48 used as a barrier film for preventing nitrogen diffusion are formed in this order all over the gate insulating film 46.

Figure 10:
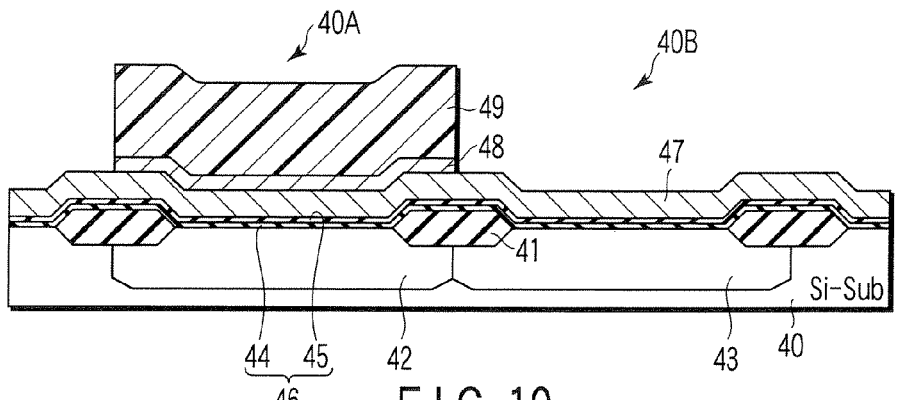

Then, as shown in FIG. 10, a photo-resist film 49 used as an etching mask is formed to cover the first area 40A. Then, a portion of the TiN film 48 corresponding to the second area 40B is removed by wet etching using $H_2O_2$ or RIE etching.

Figure 11:
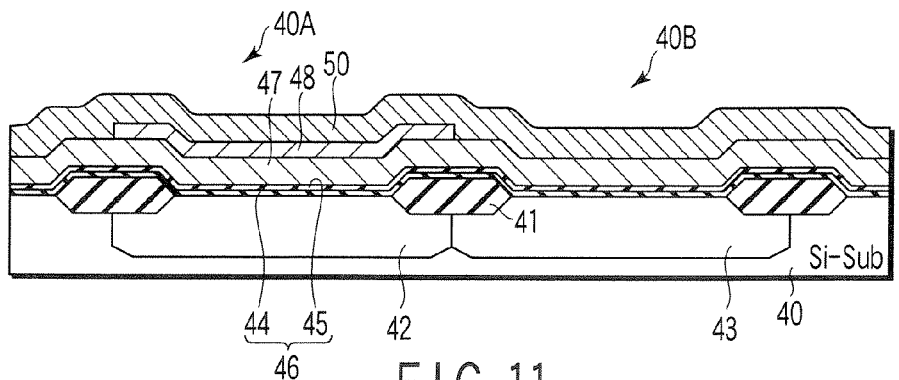

Then, as shown in FIG. 11, a Ta film 50 is formed to cover all over the substrate 40. Consequently, the Ta film 50 is present on the TiN film 48 within the first area 40A, while the Ta film 50 is present directly on the TaN film 47 within the second area 40B.

Figure 12:
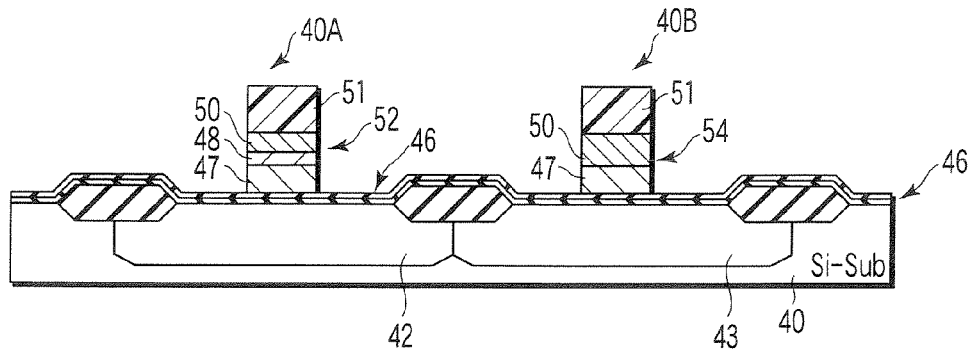

Then, as shown in FIG. 12, a resist pattern 51 for forming gate electrodes is formed by a photolithography method. Then, using the resist pattern 51, anisotropic etching, such as RIE, is performed. Consequently, a laminated body 52 having a three-layer structure consisting of remaining portions of the TaN film 47, TiN film 48, and Ta film 50 is formed within the first area 40A. Further, a laminated body 54 having a two-layer structure consisting of remaining portions of the TaN film 47 and Ta film 50 is formed within the second area 40B. At this time, in order to protect the laminated bodies 52 and 54, a cap film (not shown), such as a silicon nitride film or silicon oxide film, is preferably formed before the photo-resist pattern 51 is formed.

Then, as shown in FIG. 13, the gate insulating film 46 is etched to remove the unnecessary portion thereof exposed on the substrate surface around the laminated bodies 52 and 54. Then, extensions 56 and 58 are formed within the first and second areas 40A and 40B, respectively, by conventional techniques, as in the first embodiment.

Then, as shown in FIG. 14, a gate sidewall 60 consisting of an insulating film is formed on each of the laminated bodies 52 and 54. For example, the gate sidewall 60 is preferably formed of a silicon nitride film. Then, n-type source/drain layers 61 and 62 are formed within the first area 40A by ion implantation using the laminated body 52 and the sidewall 60 thereof as a mask. Similarly, p-type source/drain layers 63 and 64 are formed within the second area 40B by ion implantation using the laminated body 54 and the sidewall 60 thereof as a mask.

Then, as shown in FIG. 15, annealing is performed to electrically activate ion-implanted impurities in the substrate 40, and to diffuse N in the laminated body 54 of the second area 40B from the TaN film 47 to Ta film 50 by solid-phase diffusion. Consequently, a single layer having an N-concentration lower than that in the TaN film 47 is formed as a conductive layer 55. By adjusting the N-concentration of the layer, the work function of the layer can be controlled, so the threshold voltage of the transistor can be controlled. At this time, the annealing conditions are set to be the same as those used in the first embodiment. In the laminated body 52 of the first area 40A, due to the presence of the TiN film 48 used as a barrier film, N diffusion from the TaN film 47 to the Ta film 50 is hardly caused. It suffices if the thickness of TiN film 48 is set to be about 10 to 20 nm, because the thickness only needs to provide the film with the necessary barrier function.

Thereafter, inter-level insulating films, interconnections, and so forth are formed by conventional techniques to complete the n-type MISFET 65 and p-type MISFET 66 within the first and second areas 40A and 40B, respectively. Specifically, the n-type MISFET 65 has a gate electrode formed of the laminated body 52 consisting of remaining portions of the TaN film 47, TiN film 48, and Ta film 50. On the other hand, the p-type MISFET 66 has a gate electrode formed of a conductive layer 55 derived from the laminated body 54 consisting of remaining portions of the TaN film 47 and Ta film 50. In this structure, the laminated body 52 includes a conductive layer 52a consisting of a remaining portion of the TaN film 47 in contact with the gate insulating film 46. Since the conductive layer 52a maintains the initial nitrogen concentration due to the barrier function of the TiN film 48, the conductive layer 52a has the initial work function of the TaN film 47. On the other hand, since the conductive layer 55 in contact with gate insulating film 46 has a nitrogen concentration lower than that of the TaN film 47 due to nitrogen diffusion, the conductive layer 55 has a higher work function, as in the first embodiment.

Specifically, the lowermost portion (conductive layer 52a) of the gate electrode of the n-type MISFET 65 is set to have a work function of 3.9 to 4.2 eV, which is close to that of $n^+$-poly-crystalline silicon, to decrease the threshold voltage of the n-type MISFET. On the other hand, the lowermost portion (conductive layer 55) of the gate electrode of the p-type MISFET 66 is set to have a work function of 4.8 to 5.3 eV, which is close to that of $p^+$-poly-crystalline silicon, to decrease the threshold voltage of the p-type MISFET. The preset values of the thicknesses of the TaN film 47 and Ta film 50 and the nitrogen concentration of the TaN film 47 are adjusted to control the nitrogen concentrations of the conductive layers 52a and 55 that are factors for determining the work functions of the conductive layers 52a and 55. Since TaN greatly varies in work function with change in N-concentration, the work function of the conductive layer 55 can be reliably controlled by, e.g., utilizing the thickness of the Ta film 50 as a parameter.

In the first embodiment, the gate electrode of the n-type MISFET 35 is formed only of a portion of the TaN film, while the gate electrode of the p-type MISFET 36 is formed of a laminated body formed of portions of the TaN film and Ta film. Consequently, these gate electrodes differ in thickness and result in a stepped portion, which may cause problems in the manufacturing process. In this respect, the second embodiment does not entail such a large stepped portion, and thus is advantageous in processing. However, in the second embodiment, the only important part of the gate electrode of the n-type MISFET 65 is the lowermost portion or conductive layer 52a. Accordingly, the patterning shown in FIG. 12 may be arranged to remove a portion of the Ta film 50 corresponding to the gate electrode of the n-type MISFET 65, if necessary.

As described above, according to the first and second embodiments of the present invention, the work functions of the gate electrodes can be controlled with high accuracy. Further, the gate electrodes of the n-type MISFET and p-type MISFET are made of a common material. Accordingly, it is possible to simplify the steps of dual gate electrode processes.

The present invention is not limited to the embodiments described above, and it may be modified in various manners. For example, in the embodiments described above, the semiconductor device to be formed is exemplified by a complementary transistor of the MIS type. However, the present invention may be widely used to control the work function of gate electrodes in semiconductor devices of the MIS type. Further, Ta is described as an example of the predetermined metal to form a metal nitride, but another metal, such as W, may be used as the predetermined metal.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
a substrate including a first semiconductor layer of a first conductivity type and a second semiconductor layer of a second conductivity type at a surface;
first and second gate insulating films disposed on the first and second semiconductor layers, respectively;
a first gate electrode disposed on the first gate insulating film, and including a first conductive layer consisting of a nitride of a predetermined metal in contact with the first gate insulating film, the first conductive layer having a first nitrogen concentration; and
a second gate electrode disposed on the second gate insulating film, and including a second conductive layer consisting of a nitride of the predetermined metal in contact with the second gate insulating film, the second conductive layer having a second nitrogen concentration lower than the first nitrogen concentration,
wherein the first conductive layer is formed from a first film consisting of a nitride of the predetermined metal, and the second conductive layer is formed by stacking the first film and a second film consisting of the predetermined metal, and diffusing nitrogen from the first film to the second film by diffusion, and
wherein the first gate electrode further comprises a portion derived from the second film and stacked on the first conductive layer through an electrically-conductive barrier layer for preventing nitrogen diffusion.

2. The device according to claim 1, further comprising a first pair of source/drain layers formed in the first semiconductor layer one on either side of the first gate electrode, and a second pair of source/drain layers formed in the second semiconductor layer one on either side of the second gate electrode.

3. The device according to claim 1, wherein the predetermined metal is selected from a group consisting of Ta and W.

4. The device according to claim 1, wherein the first semiconductor layer is a p-type silicon layer and the second semiconductor layer is an n-type silicon layer, and wherein the first conductive layer has a work function of 3.9 to 4.2 eV and the second conductive layer has a work function of 4.8 to 5.3 eV.

5. The device according to claim 1, wherein the first conductive layer has a first thickness $T1$ and a first nitrogen concentration $C1$, and the second conductive layer has a second thickness $T2$ and a second nitrogen concentration $C2$, to satisfy $C1>C2$, $T1<T2$, and $C1 \times T1 \cong C2 \times T2$.

6. The device according to claim 1, wherein the barrier layer is a TiN layer.

7. The device according to claim 6, wherein the TiN layer has a thickness of 10 to 20 nm.

8. A semiconductor device, comprising:
a substrate including a first semiconductor layer of a first conductivity type and a second semiconductor layer of a second conductivity type at a surface;
first and second gate insulating films disposed on the first and second semiconductor layers, respectively;
a first gate electrode disposed on the first gate insulating film, and including a first conductive layer consisting of a nitride of a predetermined metal in contact with the first gate insulating film, the first conductive layer having a first thickness $T1$ and a first nitrogen concentration $C1$; and
a second gate electrode disposed on the second gate insulating film, and including a second conductive layer consisting of a nitride of the predetermined metal in contact with the second gate insulating film, the second conductive layer having a second thickness $T2$ and a second nitrogen concentration $C2$,
wherein the device is arranged to satisfy $C1>C2$, $T1<T2$, and $C1 \times T1 \cong C2 \times T2$, and
wherein the first gate electrode further comprises an upper layer consisting of the predetermined metal and stacked on the first conductive layer through an electrically-conductive barrier layer for preventing nitrogen diffusion.

9. The device according to claim 8, wherein the first semiconductor layer is a p-type silicon layer and the second semiconductor layer is an n-type silicon layer, and wherein the first conductive layer has a work function of 3.9 to 4.2 eV and the second conductive layer has a work function of 4.8 to 5.3 eV.

10. The device according to claim 8, wherein the predetermined metal is selected from a group consisting of Ta and W, and the barrier layer is a TiN layer.

11. A semiconductor device, comprising:
a substrate including a first semiconductor layer of a p-type and a second semiconductor layer of an n-type at a surface;
first and second gate insulating films disposed on the first and second semiconductor layers, respectively;
a first gate electrode disposed on the first gate insulating film, and including a first conductive layer consisting of TaN in contact with the first gate insulating film, the first conductive layer having a first thickness $T1$ and a first nitrogen concentration $C1$;
a second gate electrode disposed on the second gate insulating film, and including a second conductive layer consisting of TaN in contact with the second gate insulating film, the second conductive layer having a second thickness $T2$ and a second nitrogen concentration $C2$;
a first pair of source/drain layers formed in the first semiconductor layer, one of the first pair of source/drain layers positioned on either side of the first gate electrode; and
a second pair of source/drain layers formed in the second semiconductor layer, one of the second pair of source/drain layers positioned on either side of the second gate electrode,
wherein the device is arranged to satisfy $C1>C2$, $T1<T2$, and $C1 \times T1 \cong C2 \times T2$, and
wherein the first gate electrode further comprises an upper layer consisting of Ta and stacked on the first conductive layer through a barrier layer formed of a TiN layer for preventing nitrogen diffusion.

12. The device according to claim 11, wherein the first semiconductor layer is a p-type silicon layer and the second semiconductor layer is an n-type silicon layer, and wherein the first conductive layer has a work function of 3.9 to 4.2 eV and the second conductive layer has a work function of 4.8 to 5.3 eV.

13. The device according to claim 11, wherein the TiN layer has a thickness of 10 to 20 nm.

* * * * *